United States Patent [19]

Jørgensen

[11] Patent Number: 4,616,174
[45] Date of Patent: Oct. 7, 1986

[54] DETECTOR CIRCUIT FOR CURRENT MEASUREMENTS

[75] Inventor: Hans-Erik Jørgensen, Jyllinge, Denmark

[73] Assignee: Danfysik A/S, Jyllinge, Denmark

[21] Appl. No.: 650,718

[22] Filed: Sep. 14, 1984

[30] Foreign Application Priority Data

Sep. 15, 1983 [DK] Denmark ............................ 4216/83

[51] Int. Cl.$^4$ .......................................... G01R 19/00
[52] U.S. Cl. ..................................... 324/117 R; 324/127
[58] Field of Search ................... 324/117 R, 127, 115, 324/200, 254; 323/356, 357; 330/8; 307/512, 350; 328/162, 165, 166

[56] References Cited

U.S. PATENT DOCUMENTS 4,274,051 6/1981 Condon ........................... 324/117 R
4,278,939 7/1981 Henry ............................. 324/117 R

OTHER PUBLICATIONS

Jacques Lisser et al., Nullfluss-Stromwandler zur Messung von Gleich- und Wechselströmen, ETZ, vol. 100 (1979) Issue No. 24, pp. 1390-1394.
M. Groenenboom et al., The Zero-Flux Current Transformer—A High Precision Wide-Band Measuring Device, Bull. Sci. Assoc. Ing. Electr. Inst. Electrotech. Montegiore (Belgium), vol. 90, No. 2, pp. 22-25, Apr.-Jun. 1977.
H. C. Appelo et al. The Zero-Flux DC Current Transformer—A High Precision Bipolar Wide-Band Measuring Device, IEEE Transactions on Nuclear Science, vol. NS-24, No. 3, Jun. 1977. pp. 1810-1811.

Primary Examiner—Reinhard J. Eisenzopf
Assistant Examiner—William J. Burns
Attorney, Agent, or Firm—Cushman, Darby & Cushman

[57] ABSTRACT

The measurement of large DC and AC currents, are measured by a zero-flux current transformer. Two identically wound toroidal cores in which the magnetic flux induced by a primary current is neutralized by a counter-flux induced by a compensation current is passed through a compensation winding (14) common to both cores and having many turns. The compensation current is adjusted by means of an amplifier so that the mean flux in the cores is zero. The intensity of the compensation current is measured by the voltage drop across a measuring resistor. Any unbalances between the primary and secondary ampere-turns are sensed by a detecting circuit comprising of a sensing winding wound on each core and divided into two subwindings which carries a magnetizing current from a current source in such a way that the odd-harmonic components contained in the magnetizing current are outbalanced, while the even-harmonic components contained therein are added and conducted to a rectifier to provide a control signal to the amplifier for the adjusting of the compensation current. A greatly improved signal-to-noise ratio for the signal is obtained.

4 Claims, 3 Drawing Figures

DETECTOR CIRCUIT FOR CURRENT MEASUREMENTS

BACKGROUND OF THE INVENTION

This invention relates to a detector circuit to be used in current measurements. The circuit comprises two identically wound toroidal transformers, in which a main current, the primary current, induces magneto-motive forces. These forces are in turn neutralized by other magneto-motive forces induced therein by a compensation current, the secondary current. The detector circuit further includes sensing windings wound on each toroidal core, at least one of which sensing windings carries a magnetizing current, the sensing current, from an external current source. The sensing current is conducted to a synchronous rectifier to provide a d.c. control signal for the compensation current.

From the literature, cf e.g., ETZ, Vol 100, 1979, No. 24, pp 1390-94, a zero-flux current transformer is known which is used for the measurement of the current supplied to an electromagnet in a particle accelerator. Since very heavy currents of several hundred amperes are involved, it is appropriate to convert the main (primary) current into a more handy measuring current of a reduced intensity and conduct this current through a measuring resistor. The voltage drop over this measuring resistor is then used as a measure of the intensity of the main current.

The prior art zero-flux current transformers consist in a combination of a magnetic integrator and a 2nd-harmonic magnetic modulator.

The magnetic integrator is in principle comprised by a ring-shaped or toroidal core of a ferromagnetic material having a primary winding, a secondary winding and a sensing or indicating winding. The latter winding is connected to the input terminals of an amplifier, which drives the secondary current through a measuring resistor. Any change of the magnetic flux in the toroid will induce a voltage across the sensing winding, which voltage will influence the amplifier to provide a compensation current to neutralize the change of flux provided by the primary current. The magneto-motive forces induced by the current through the primary winding will thus be outbalanced that is, cancelled out by the magneto-motive forces induced by the current through the secondary winding, so that there exists a certain ratio between the current intensities in the primary and the secondary windings.

However, offset voltages occurring in practice and the fact that the obtainable amplification in the feedback loop is not infinite, imply that a small voltage is induced in the sensing winding, which inevitably results in a gradual increase of the flux until the core is saturated. In order to stabilize the flux at a zero value, a further toroid is used, which is as identical as possible to the first one and which operates as a 2nd-harmonic modulator sensing any possible unbalances between the magneto-motive forces on the primary and on the secondary side. By a perfect balance, the magnetizing current through the sensing winding on said further toroid is symmetrical and therefore contains odd-harmonic components only, and the output signal from the synchronous rectifier, cf. the article, is zero. If an unbalance occurs between the induced magneto-motive forces, the mean flux will differ from zero, resulting in an asymmetric magnetizing current, which further contains even-harmonic components, of which the 2nd-harmonic is by far the dominant one. Its amplitude and phase depends on the magnitude and sign of the unbalance. By detection of this 2nd harmonic, there is derived a d.c. signal corresponding to the unbalance, which signal is used to control the amplifier in the secondary circuit in such a way that the balance between the magneto-motive forces induced by the primary and secondary currents is reestablished.

The most serious disadvantage of this circuit is that it is very costly in components. Just the employed 2nd-harmonic bandpass filter, which is an active filter to treat a very composite signal containing a large number of even- and odd-harmonic components, needs a large amount of circuitry.

SUMMARY OF THE INVENTION

According to the present invention, there is provided a detector circuit which distinguishes itself from prior art circuits in that two sensing windings are wound on said two toroids or cores to magnetize them in mutually opposite senses by the sensing current, each of these two sensing windings being further being divided into two equal subwindings in such a manner that the ampere-turns of all four subwindings are substantially equal. The subwindings are connected mutually and to the current source in such a manner that the magnetizing currents through the four subwindings are so controlled by means of gating or switching devices that the odd-harmonic components of the magnetizing currents are outbalanced whereas the even-harmonic components are added.

The invention makes use of the fact that the mean flux in the cores is zero when a balance exists between the fields induced by the primary and secondary currents. The magnetizing currents in the two sensing windings thus become symmetrical and therefore contains only odd-harmonic components. If, on the other hand, the mean flux differs from zero because of an unbalance between the induced fields, e.g., unbalance between the ampere-turns of the main current and of the compensation current, then the magnetizing currents in the sensing windings will contain even-harmonic components too, of which the 2nd-harmonic is the most important because its amplitude is proportional to the degree of unbalance.

By the above mentioned means a very simple selection of the even-harmonics is obtained, as the magnetizing or sensing currents through the subwindings are conducted to the synchronous rectifier in mutual counterphase having the effect that all the odd-harmonics directly outbalance each other including the 1st-harmonic, while all the even-harmonics are added. Any desired further selection of the 2nd-harmonic may then be done by means of a simple tuned circuit in the synchronous detector or rectifier. The need for a complicated and expensive active filter is thus eliminated. By directly outbalancing all the odd-harmonics, a control signal is provided with a far better signal-to-noise ratio than in the prior art detector circuits. Simultaneously, the odd-harmonics do not strain the synchronous detector to thereby reduce the possible dynamic range.

By connecting the subwindings through an auxiliary transformer, the primary winding of which at a center tap thereof is connected to said current source and at outer terminals thereof to said sensing windings in such manner that one of said outer terminals is connected to a plus-terminal of one of the subwindings on each toroid or core and the other one of the outer terminals to a minus-terminal of the other subwinding on each toroid or core, and wherein a secondary winding of said auxiliary transformer is incorporated as a part of the synchronous rectifier, whereas the remaining four terminals of the subwindings are connected through gating or switching devices to a control signal generator to supply a symmetric square wave voltage signal to selectively controlling of the magnetizing current through the sensing windings, there is provided a detector circuit which ensures a galvanic separation between the measuring circuitry and the measured object. This solves a problem regarding measuring technique or method which in connection with equipment used hitherto has resulted in many short circuits and erroneous measurements, because it is common practice all over the world to earth or ground all terminals, so that the possibility to make (also d.c.) current measurements internally of a circuit so far has been very limited. This limitation is now eliminated by a detector circuit of the present invention, because a current measuring device may now be produced for a price which is only a minor fraction of the present price and therefore no longer prohibitive for such applications.

It is furthermore obtained that all even-harmonics are summed directly in the primary winding of the auxiliary transformer, and that the maximum power signal is transferred to the synchronous detector or rectifier.

Another embodiment of the detector circuit is according to the invention characterized in that the subwindings on each toroid respectively, are series connected with a minus-terminal to a plus-terminal thus forming a center tap of each sensing winding, the center tap of each sensing winding being connected mutually and directly to said synchronous rectifier via a summing resistor or a summing amplifier, and wherein each of said sensing windings are connected with one of their free terminals to a positive voltage source and with the remaining free terminal to a negative voltage source through suitable current limiting switch means to selectively supplying of magnetizing current to said four subwindings. In this embodiment the auxiliary transformer is saved, whereby it has become possible to produce the entire detector circuit in "solid state" technology, which further reduces the production costs and expands the potential applications.

Another embodiment of the lastmentioned detector circuit is according to the invention characterized in that all four subwindings are series connected in such a manner that the sensing windings at their junction are interconnected back-to-back in a magnetical sense, said junction being connected to said synchronous rectifier through a summing resistor or a summing amplifier, and the outer terminals of said series connected sensing windings each being connected to a positive and a negative voltage source, respectively, through individual sets of current limiting switch means to selectively supplying of magnetizing current to said two sensing windings.

This embodiment involves the same possibilities as that mentioned above.

BRIEF DESCRIPTION OF THE DRAWINGS

The invention is further explained below with reference to the drawings, in which.

DESCRIPTION OF THE PREFERRED EMBODIMENT

Figure 1:
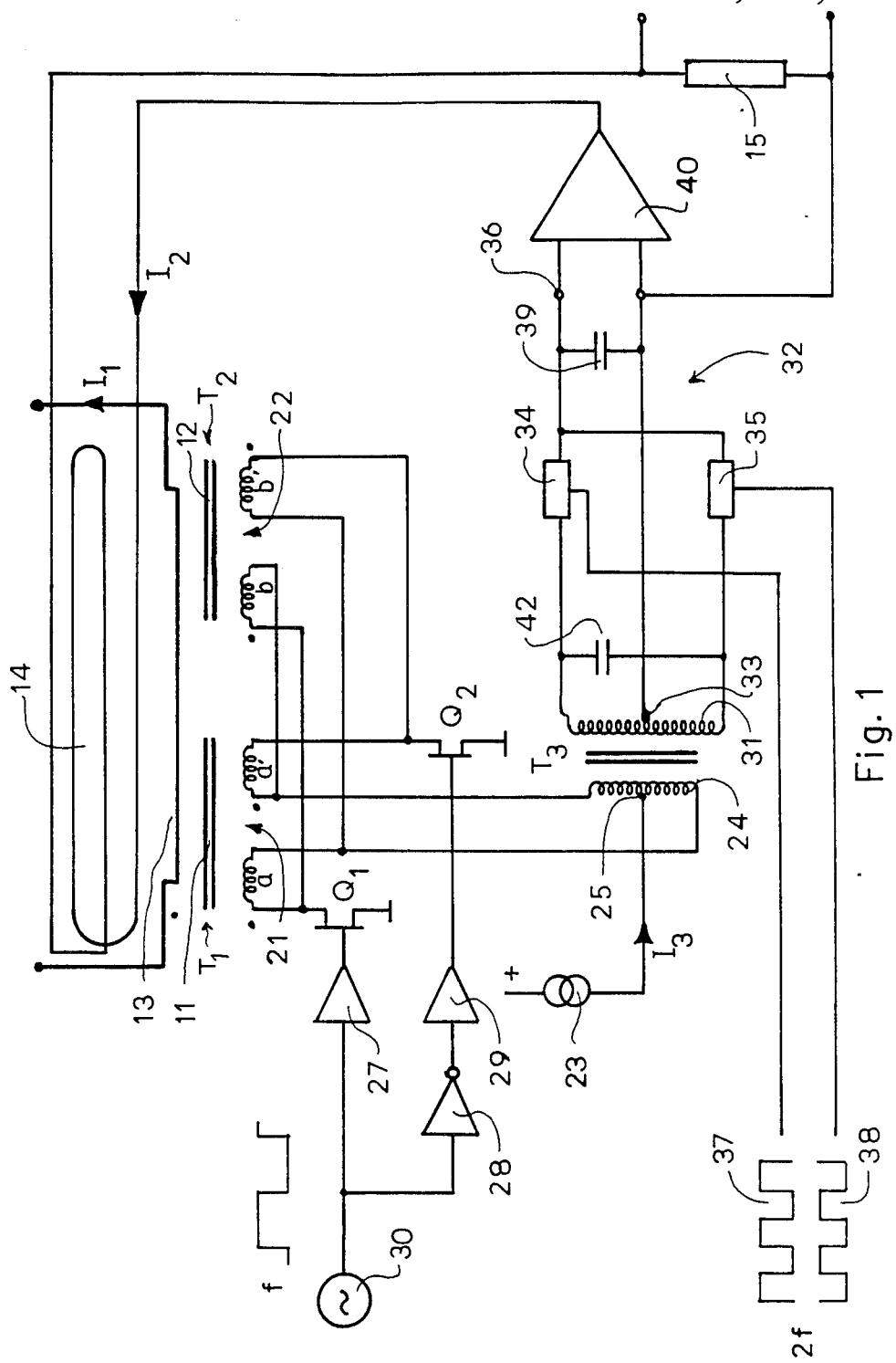
FIG. 1 is a principle diagram on a first embodiment of a detector circuit according to the invention.

FIG. 1 shows two identical toroidal transformers $T_1$ and $T_2$ respectively having cores 11 and 12, which are as identical as possible and made of a ferromagnetic material. The cores are wound in common with a primary winding 13 carrying the main current $I_1$ to be measured, and a secondary winding 14 conducting a compensation current $I_2$. By means of a conventional dot-marking of the windings it is shown that the primary and secondary currents induces magnetic fields in the cores 11 and 12 in opposite directions. If the ampere-turns of the primary and secondary windings are equal, then the flux in the two cores will be zero and the ratio between the primary current and the secondary current is given by the ratio between the number of turns of the primary and the secondary windings. As this applies to d.c. too, the set-up works as a d.c.-transformer, in which the current on the primary side may be determined by measuring the current on the secondary side. This principle is inter alia used in measuring the heavy magnetizing currents, in the order of magnitude of kiloamperes, used for magnetic current supplies for particle accelerators.

The secondary current $I_2$ is conducted through a high precision measuring resistor 15, and the voltage drop across this resistor is used as an indication of the intensity of the secondary current $I_2$ and thus indirectly the intensity of the primary current $I_1$. In order to detect the flux or the change of flux in the toroids 11 and 12, these are each wound with an individual sensing winding 21 and 22, respectively, through which is conducted a magnetizing current $I_3$ supplied by a current limiting generator or voltage source 23. In order to protect the following circuits, e.g., the synchronous rectifier, it is necessary to limit the current supplied to a certain maximum. This is conveniently indicated by the symbol for a constant current generator. To prevent the magnetizing current $I_3$ from inducing error-voltages in the primary and secondary windings 13 and 14, the sensing windings 21 and 22 are wound so that the induced voltages are opposite in phase. This is indicated by the usual dot marking.

As indicated on FIG. 1, each of the two sensing windings 21 and 22 are divided into two identical windings a and a' along with b and b', so that the ampere-turns thereof are substantially equal. Complete equality is impossible because the cores may not be manufactured identically. The cores will thus differ from one another e.g. on sintering and on sectional area. It would be necessary to include small adjusting means in each winding, in order to obtain the same ampere-turns in all four windings, but this is not shown on the drawing for reason of simplification, and because this is elementary for a skilled person. The current source 23 supplies magnetizing current to the subwindings 21a,21a', 22b and 22b' through the primary winding 24 of auxiliary transformer $T_3$, which primary winding at a center tap 25 thereof is connected to said source 23. For the sake of convenience the dot marked end of a winding will be named below as the plus-terminal and the opposite end thereof the minus-terminal.

A subwinding of each of the sensing windings, e.g., 21a' and 22b, have their plus-terminal connected to one end of the primary winding 25 of the auxiliary transformer $T_3$, whereas the opposite end of the said primary winding is connected to the two other subwindings. i.e., 21a and 22b', at their minus-terminal. The remaining four terminals are so connected, that the plus-terminal of subwinding a and the minus-terminal of subwinding b are connected to the source-drain junction of a first transistor $Q_1$, while the minus-terminal of subwinding a' and the plus-terminal of subwinding b' are connected to the source-drain junction of a second transistor $Q_2$. The gate terminals of the two transistors $Q_1$ and $Q_2$ are connected via switch means 27, 28 and 29 respectively, to a signal generator 30, the output of which is a symmetrical square wave voltage at the frequency f, the order of magnitude of which could be e.g. 1 MHz. During the positive half periods a signal will be applied via the switch means 27 to the gating terminal of the first transistor $Q_1$, so that the magnetizing current is conducted through a subwinding of each sensing winding a and b, the induced fields of which counteract one another, whereas during the negative half periods, a signal will be applied via the switch means 28 and 29 to the gating terminal of the second transistor $Q_2$, so that magnetizing current is conducted through the other subwindings a' and b' of each of the sensing windings, the fields of which also counteract one another. The flux induced in the first toroid $T_1$ by the magnetizing current through the primary coil or winding of the auxiliary transformer $T_3$, e.g. the flux provided by the subwinding a, or more correctly speaking, the electromotive forces induced by this flux will be neutralized completely by the corresponding flux induced in the second toroid $T_2$ by means of the subwinding b, as long as the system is in balance, i.e. as long as the main current $I_1$ corresponds to the compensation current $I_2$ as far as the ampere-turns is concerned. The same applies of course to the subwindings a' and b' as well.

In case the system comes out of balance, e.g., because the main current $I_1$ changes, then the flux in the cores 11 and 12 will change and induce e.m.f.'s in the sensing windings 21 and 22. The magnetizing current $I_3$ becomes asymmetric and will now also contain even-harmonic components, which, because of the polarization of the windings, are added together in the primary winding 24 of the auxiliary transformer $T_3$. These voltage components are transferred to the secondary winding 31 of the auxiliary transformer $T_3$, which secondary winding is implemented as a part of a synchronous rectifier 32. The secondary winding 31 is earthed or grounded via a center tap 33, while the outer terminals thereof via a pair of analog switch devices 34 and 35 are connected to an output terminal 36 of the rectifier. The analog switch devices 34 and 35 are controlled by a pair of square wave signals 37 and 38, which are in counterphase, and the frequency of which is twice the frequency of the control signal to the transistors $Q_1$ and $Q_2$. Thus, the shown synchronous rectifier is embodied as a full wave rectifier and operates relative to the magnetizing currents in the sensing windings 21 and 22 according to the push-pull principle. The rectified signal is smoothed by a capacitor 39 so that the detector output on terminal 36 is a d.c. signal the amplitude of which is proportional to the degree of unbalance between the main current $I_1$ and the compensation current $I_2$. The detector signal at the output terminal 36 is applied to a compensation amplifier 40, which, according to the detector signal at the input terminal, in a known way adjusts the compensation current $I_2$ to increase or decrease it in order to reestablish the balance, so that the mean flux of the cores is zeroed again.

As mentioned in the introduction, it is by this system secured that all the odd-harmonic components are directly neutralized in the primary winding of the auxiliary transformer, while the even-harmonics are summed or added together. Compared to prior art detector circuits this implies that the synchronous rectifier receives a signal having a far better signal-to-noise ratio resulting in a far better control of the compensation current $I_2$. This may if desired be further improved by a simple tuning of the secondary side of the auxiliary transformer $T_3$ to the 2nd-harmonic by means of a tuning capacitor 42.

On the drawing there is shown a full-wave rectifier, but it is equally possible to delete the center tap 33 of the auxiliary transformer's secondary winding 31, and instead design the rectifier as a full-wave bridge circuit. This will require four analog switches instead of two, but the way the detector circuit functions will not be changed. It should furthermore be noted that the current limitation of the magnetizing currents from the current source 23 is important in order to prevent a complete saturation of the cores, which otherwise could lead to a large increase of the current. This also gives a convenient way to detect when the unit operates as it should, and when it is outside its range of operation.

It should finally be noted, that the magnetizing currents to the sensing windings not necessarily are to be supplied through a center tap on the primary winding of the auxiliary transformer $T_3$ but may just as well be supplied from a symmetrical voltage source of the same kind as described below and shown in FIG. 2.

Figure 2:
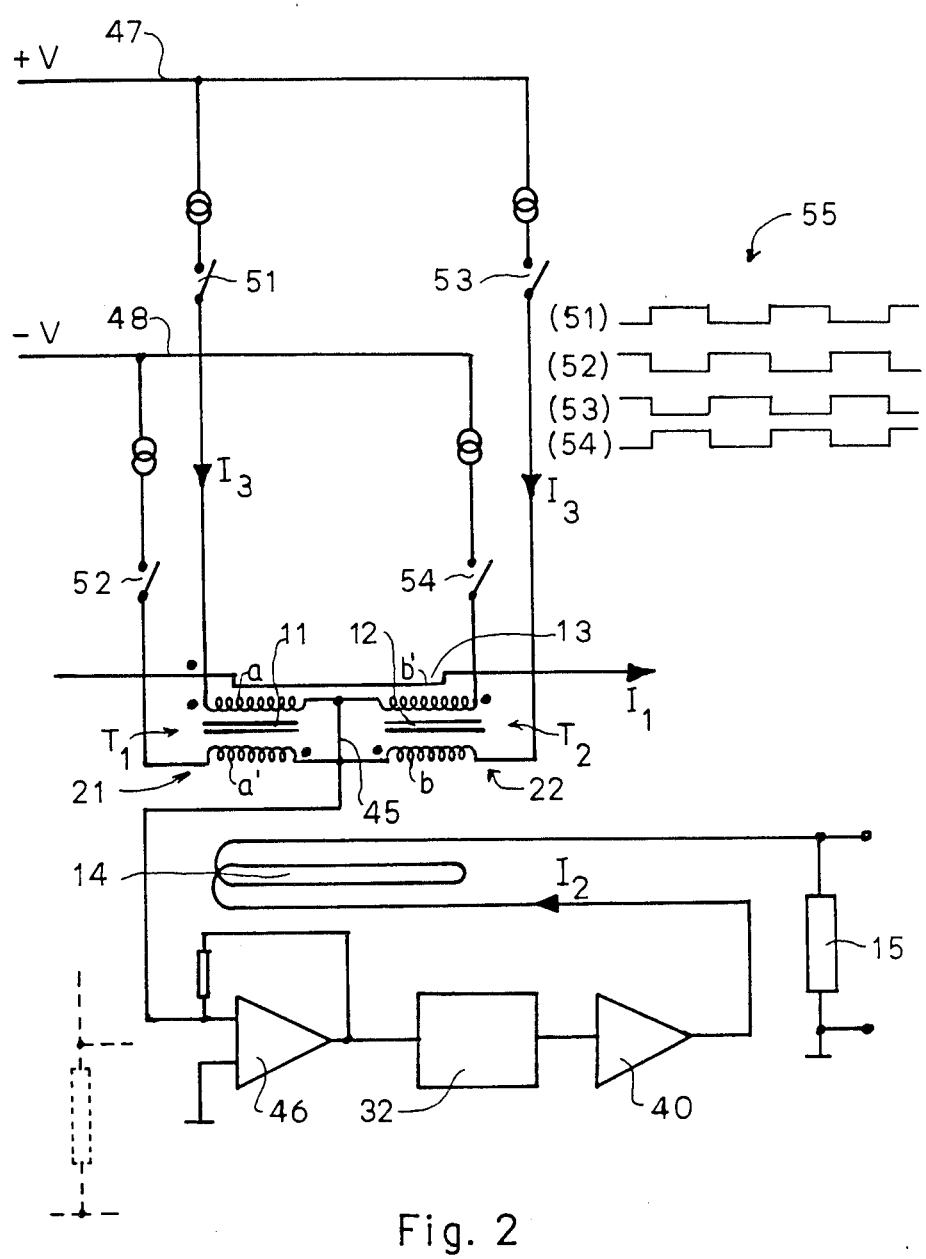
FIG. 2 is a principle diagram on a second embodiment of a detector circuit according to the invention.

A second embodiment of the detector circuit is shown in FIG. 2. Here is shown, like above, the toroidal cores 11 and 12 having the sensing windings 21 and 22 divided into subwindings a, a', b and b'. The dot markings are as above. Further, there is shown the toroidal transformer having primary and secondary windings 13 and 14 along with the measuring resistor 15 positioned like in the first embodiment. Here, the subwindings of each toroid are connected in series with a minus-terminal to a plus-terminal for the subwindings a and a', and with a plus-terminal to a minus-terminal for the subwindings b and b' which provide each sensing winding 21 and 22, respectively, with a center tap. These center taps are in turn connected to a common junction 45 which is connected to the synchronous rectifier 32 via a summing amplifier 46. The summing amplifier may of course be replaced by a summing resistor, which is indicated in dashed lines. The synchronous rectifier is in turn connected to the compensation amplifier 40.

The four subwindings receive magnetizing currents from a dual voltage supply having a positive terminal 47 and a negative terminal 48 via four switch means 51, 52, 53 and 54, so that the plus-terminal of the first sensing winding 21 and minus-terminal of the second winding 22 are connected to the positive terminal 47 via the first and the third switch means 51 and 53 respectively, while the minus-terminal of the first sensing winding 21 and the plus-terminal of the second sensing winding 22 are connected to the negative terminal 48 via the second and fourth switch means 52 and 54, respectively. Between the switch means and the positive and negative terminals there are shown the symbols for constant current generators, which here means that a sort of current limitation is provided. Such a current limiter may in its simpliest form consist of a resistor, but may just as well be a facility included in the shown switch device. Whether the current limiter is provided on the one or the other side of the switch is unimportant. The control signals for the opening and closing of the switches are generally indicated by reference numeral 55. It is shown, that the first and fourth switch means go together in counterphase with the second and third ones, so that odd-harmonic components here, as above, are outbalanced against each other, while the even-harmonic components are summed just as in the first described embodiment. This second embodiment distinguishes itself by not comprising any auxiliary transformer, which opens the possibility of designing a very compact and relatively inexpensive embodiment of the complete current detector employing integrated circuit technology, largely without giving away any of the advantages described above in connection with the first embodiment.

Figure 3:
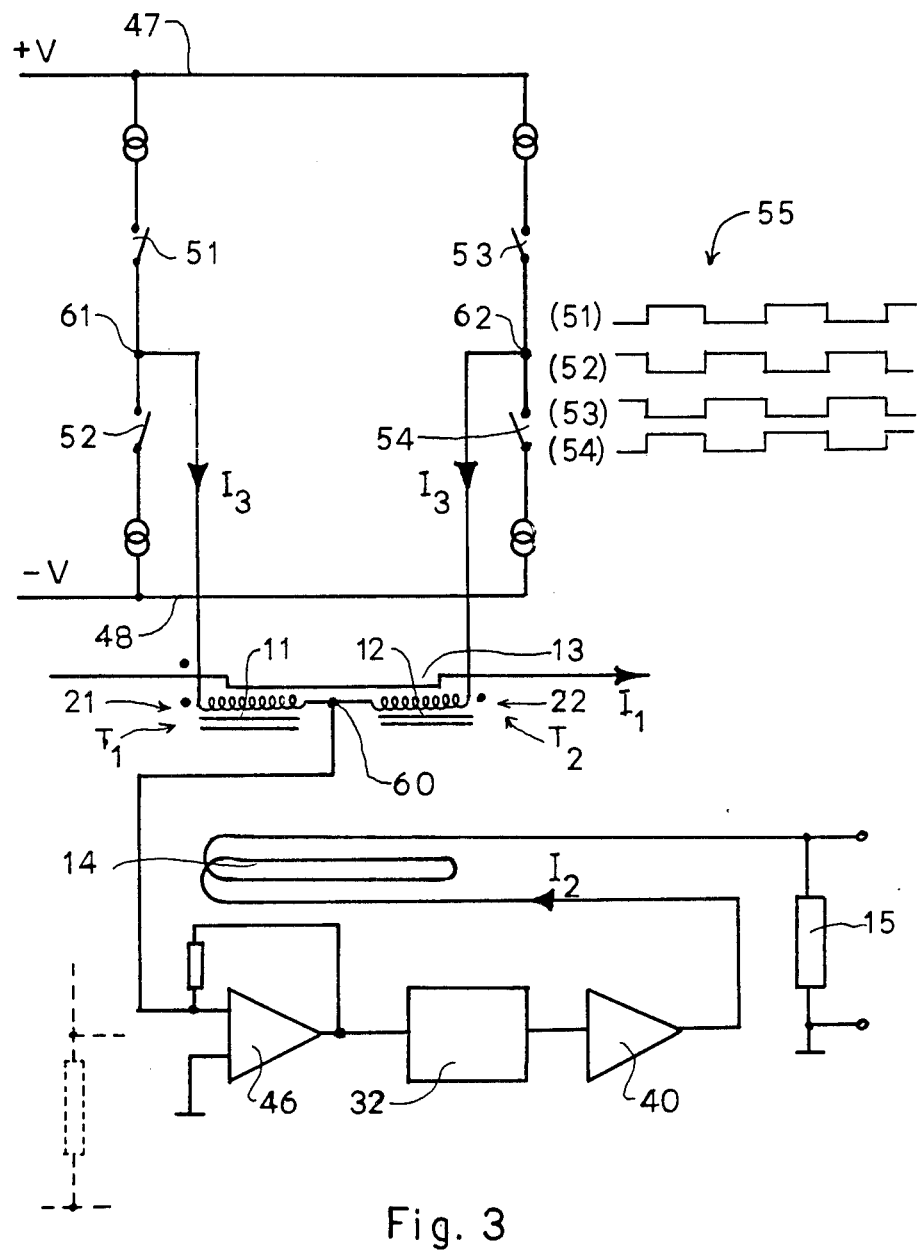
FIG. 3 is a principle diagram on a third embodiment of a detector circuit according to the invention.

A third embodiment is shown in FIG. 3, which presents an alternative to the embodiment shown in FIG. 2. The reference numerals will consequently be the same, too. Contrary to the embodiment shown in FIG. 2, here, all four subwindings are connected in series, so that the sensing windings 21 and 22 are interconnected at their minus-terminal to form a common junction 60 which is connected to the input terminal of the summing amplifier 46. Also here may the summing amplifier be replaced by a summing resistor as indicated in dashed lines. The first and second switch means 51 and 52 are further connected in series between positive and negative terminals 47 and 48 of the voltage source, and with a common junction 61 thereof connected to the plus-terminal of the first sensing winding 21 while the third and fourth switch means 53 and 54 are connected in series between said voltage source terminals and with a common junction 62 thereof connected to the plus-terminal of the second sensing winding 22. In this circuit as well, all odd-harmonic components will be outbalanced, while the even-harmonic components will be summed and provide a control signal for the compensation current $I_2$.

It only appears from the foregoing that the detector circuit is intended for d.c. measurements, but it should be added here, that it is suitable for a.c. current measurements as well. Neither are the application fields limited to magnetic current supplies for particle accelerators, but cover all areas, where there is a need for galvanic separation between the measuring circuit and the circuit to be measured on.

I claim:

1. A detector circuit to be used in current measurements, comprising:
   two toroidal transformers which are wound substantially identically, in which a primary current induces first magneto-motive forces, which first magneto-motive forces are neutralized by other magneto-motive forces induced therein by a secondary current;
   an external current source which produces a sensing current;
   two cores;
   two sensing windings wound on each said core, at least one of said sensing windings carrying said sensing current from said external current source,
   rectifier means responsive to said sensing current for producing a d.c. control signal which is used as said secondary current;
   wherein said two sensing windings are wound on said two cores in a way to magnetize each winding to have mutually opposite magnetic senses when said sensing current is passed therethrough,
   each of said two sensing windings further being divided into two equal subwindings in such a manner that a number of ampere-turns of all four subwindings are substantially equal, said subwindings further being connected to each other,
   a plurality of switching means, coupled to said external current source and said subwindings, for selectively applying said sensing current to different ones of said subwindings; and
   means for controlling said switching means in a way such that odd-harmonic components of said sensing currents passing through said subwindings are outbalanced and even-harmonic components thereof are added.

2. A detector circuit as claimed in claim 1, wherein said subwindings and said rectifier means are connected through an auxiliary transformer, having: (a) a primary winding which has a center-tap connected to said external current source and outer terminals, which are connected to said sensing windings in such a manner that one of said outer terminals is connected to a positive terminal of one of said subwindings on each core and the other of said outer terminals is connected to a negative terminal of the other subwinding on each core, and (b) a secondary winding coupled to said rectifier means, wherein the remaining four terminals of said subwindings are connected through said switching means to said controlling means which supplies a symmetric square wave voltage signal to selectively control said sensing current through said sensing windings.

3. A detector circuit as claimed in claim 1, wherein said subwindings on each core are series connected with a negative terminal connecting to a positive terminal, thus forming a center tap of each sensing winding;
   further comprising summing means, connecting said center tap of each sensing winding to said rectifier means, for adding a plurality of signals;
   wherein each of said sensing windings have one of their free terminals connected to a positive voltage source and have a remaining free terminal connected to a negative voltage source; and
   current limiting switching means coupled between said voltage sources and said sensing windings, for selectively supplying sensing current to said four subwindings.

4. A detector circuit as claimed in claim 1, wherein said four subwindings are series connected in such a manner that said sensing windings at their junction are interconnected at a junction to form two coils with opposite polarities, further comprising:
   summing means, coupled between said rectifier means, and the outer terminals of said series connected sensing windings, for adding a plurality of signals;
   a positive voltage source;
   a negative voltage source; and
   a plurality of current limiting switching means for selectively supplying sensing current to said two sensing windings.

* * * * *